United States Patent
Sekimoto et al.

(10) Patent No.: US 7,342,454 B2
(45) Date of Patent: Mar. 11, 2008

(54) ANALOG MULTISTAGE AMPLIFICATION CIRCUIT IN THE FIELD OF SENSOR

(75) Inventors: Seiji Sekimoto, Kasugai (JP); Kazunori Nishizono, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 148 days.

(21) Appl. No.: 11/401,451

(22) Filed: Apr. 11, 2006

(65) Prior Publication Data

US 2007/0146075 A1 Jun. 28, 2007

(30) Foreign Application Priority Data

Dec. 22, 2005 (JP) ............................. 2005-369586

(51) Int. Cl.
*H03G 3/30* (2006.01)
(52) U.S. Cl. ...................... 330/279; 330/133; 330/136
(58) Field of Classification Search ............... 330/133, 330/136, 279
See application file for complete search history.

(56) References Cited

U.S. PATENT DOCUMENTS

| 5,168,505 A | * | 12/1992 | Akazawa et al. .......... 375/130 |
| 6,331,802 B1 | * | 12/2001 | Kim ........................ 330/133 |
| 6,583,667 B1 | | 6/2003 | Dasgupta et al. |
| 6,750,713 B1 | | 6/2004 | Wyszynski |
| 6,873,208 B2 | * | 3/2005 | Shinjo et al. .............. 330/129 |
| 2005/0083125 A1 | | 4/2005 | Masahiko |

FOREIGN PATENT DOCUMENTS

| EP | 1 289 124 A2 | 3/2003 |
| JP | 6-138885 A | 5/1994 |
| JP | 11-154839 A | 6/1999 |
| JP | 2004-343539 A | 12/2004 |

* cited by examiner

*Primary Examiner*—Steven J. Mottola
(74) *Attorney, Agent, or Firm*—Arent Fox, LLP.

(57) ABSTRACT

An analog multistage amplification circuit for keeping the total gain of analog amplifiers constant while automatically controlling gain of the amplifiers in accordance with an input signal level and improving the S/N ratio of the output signal. The amplification circuit includes an input stage amplifier, an output stage amplifier, a filter connected between the input and output stage amplifiers, an auto gain control circuit for generating a control signal for controlling the gain of the input stage amplifier based on the output signal of the input stage amplifier so that the output signal has a maximum level, and a first gain adjustment circuit for generating an adjustment signal for adjusting the gain of the output stage amplifier so that the total gain of the input and output stage amplifiers is kept constant in accordance with the control signal of the auto gain control circuit.

11 Claims, 12 Drawing Sheets

US 7,342,454 B2

ANALOG MULTISTAGE AMPLIFICATION CIRCUIT IN THE FIELD OF SENSOR

CROSS-REFERENCE TO RELATED APPLICATIONS

This application is based upon and claims the benefit of priority from the prior Japanese Patent Application No. 2005-369586, filed on Dec. 22, 2005, the entire contents of which are incorporated herein by reference.

BACKGROUND OF THE INVENTION

The present invention relates to an amplification circuit, and more specifically, to an analog multistage amplification circuit for amplifying a small input signal.

Recently, sensors are used in various fields, and sensors are being miniaturized. Miniaturized sensors generate small output signals. Therefore, an analog multistage amplification circuit, which amplifies the small output signal of a sensor, must have an improved S/N ratio.

FIG. 1 is a schematic circuit diagram showing an analog multistage amplification circuit 100 for amplifying a small input signal Vin output from a device such as a sensor. Input stage and output stage amplifiers 1 and 2, which are connected in series, amplify the input signal Vin and generate an output signal Vout. A high-pass filter 3 is connected between the input stage and the output stage amplifiers 1 and 2 to remove low frequency noise from an output signal of the input stage amplifier 1.

The total gain of the amplification circuit 100, which corresponds to a value obtained by multiplying the gain of the amplifier 1 and the gain of the amplifier 2, is set to be constant. In order to improve the S/N ratio of the amplification circuit 100, the gain of the amplifier 1 is set to a relatively large value and the high-pass filter 3 attenuates noise components contained in the output signal of the amplifier 1. It is desirable that the filtered output signal then be amplified so that the total gain becomes constant in the amplifier 2.

However, if the gain of the amplifier 1 is increased, a saturated state, in which the amplitude of the output signal of the amplifier 1 exceeds the operation voltage range, may occur when the amplitude of the input signal increases. In such a case, stable amplification cannot be performed. Therefore, the gain of the amplifier 1 must be set to a value applicable to the maximum value of the tolerable input signal. Further, the gain of the amplifier 2 must be set to a value ensuring the total gain. When the gain is set in such a manner, the gain of the amplifier 1 cannot be set to a sufficiently large value, and the gain of the amplifier 2 cannot be set to a small value. Consequently, noise components provided to the amplifier 2 cannot be sufficiently attenuated, and the S/N ratio of the output signal Vout cannot be increased.

Japanese Laid-Open Patent Publication no. 6-138885 describes a gain control unit for keeping the total gain constant (refer to FIG. 2 of the publication). That is, the gain control unit controls the gain of a variable gain amplifier and an input value of a scaling unit based on an output signal of an AD converter. When the gain of the variable gain amplifier is set to n times, the input value of the scaling unit is set to 1/n times. Through such control, the gain of the variable gain amplifier is adjusted so that it is included in the dynamic range of the AD converter, and the gain is controlled to be constant from an error microphone to an adaptive signal processor.

Japanese Laid-Open Patent Publication No. 11-154839 describes a configuration for setting a constant total gain for a plurality of variable gain amplifiers.

Japanese Laid-Open Patent Publication No. 2004-343539 describes an example of a gain adjustable differential input amplifier.

SUMMARY OF THE INVENTION

In the amplification circuit 100 shown in FIG. 1, the gain of the amplifier 1 must be set to a value applicable to the maximum value of the tolerable input signal. Thus, a sufficiently large gain cannot be set and the S/N ratio cannot be increased.

Since the gain control unit described in Japanese Laid-Open Patent Publication No. 6-138885 is arranged to control the gain of the variable gain amplifier and the input value of the scaling unit based on the output signal of the AD converter, the total gain of the analog amplifier cannot be controlled. The output level of the variable gain amplifier cannot be linearly controlled with the control based on the output signal of the AD converter.

The present invention provides an analog multistage amplification circuit for controlling the gain of a plurality of analog amplifiers in accordance with the input signal level, keeping the total gain of each amplifier constant, and improving the S/N ratio of the output signal.

One aspect of the present invention is an analog multistage amplification circuit including an input stage amplifier for receiving an input signal and generating a first output signal. A filter, connected to the input stage amplifier, attenuates a noise component contained in the first output signal and generates a filtered first signal. An output stage amplifier, connected to the filter, receives the filtered first output signal and generates a second output signal. An auto gain control circuit, connected to the input stage amplifier, generates a control signal for controlling gain of the input stage amplifier based on the first output signal of the input stage amplifier so that the first output signal has a maximum level. A first gain adjustment circuit, connected to the output stage amplifier and the auto gain control circuit, generates an adjustment signal for adjusting the gain of the output stage amplifier so that the total gain of the input stage amplifier and the output stage amplifier is kept constant in accordance with the control signal of the auto gain control circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
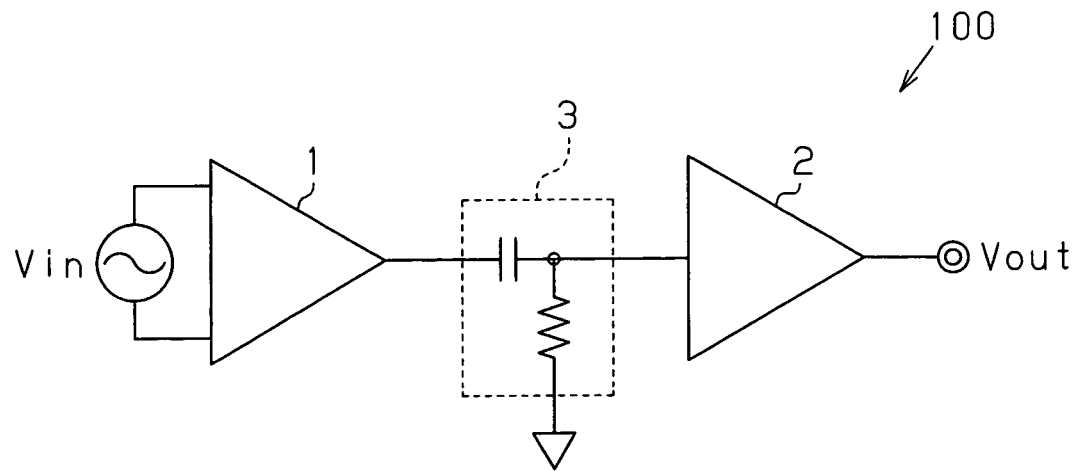
FIG. 1 is a circuit diagram showing a prior art example.

In the drawings, like numerals are used for like elements throughout.

Figure 2:
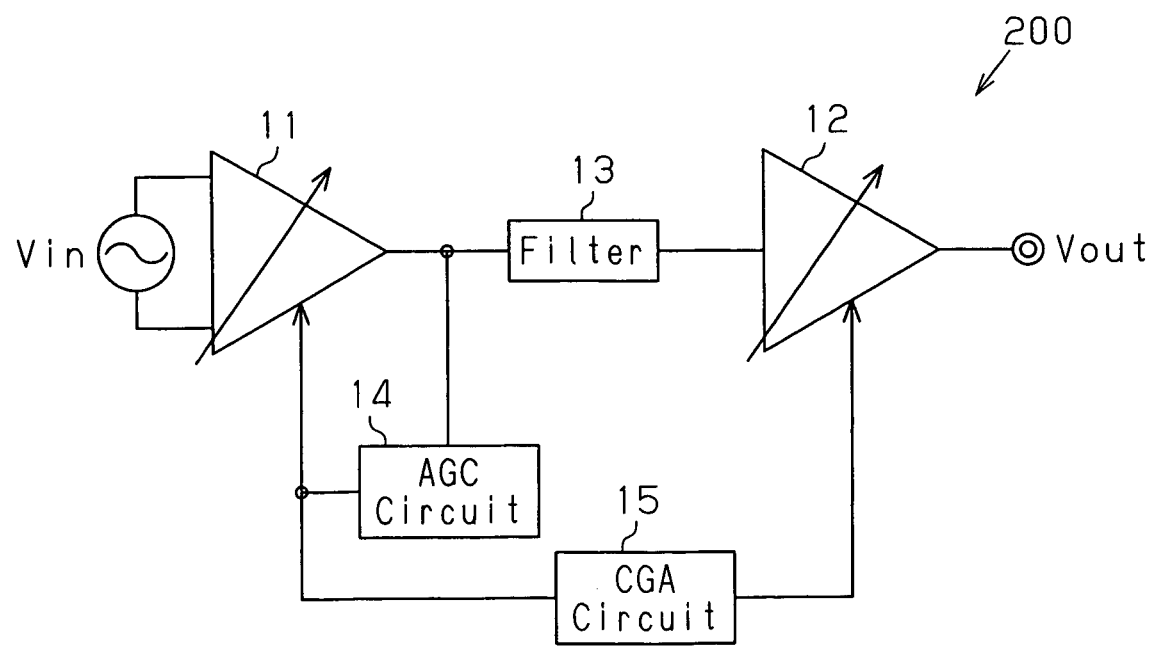
FIG. 2 is a schematic block diagram of an analog multistage amplification circuit according to a first embodiment of the present invention.

FIG. 2 is a schematic block diagram of an analog multistage amplification circuit 200 according to a first embodiment of the present invention. The analog multistage amplification circuit 200 includes an input stage amplifier 11 and an output stage amplifier 12 connected in series, a filter 13, an auto gain control (AGC) circuit 14, and a control gain amplifier (CGA) circuit 15. The input stage amplifier 11 and the output stage amplifier 12, which are connected in series, amplify the input signal Vin and generate the output signal Vout. A filter 13 is connected between the input and output stage amplifiers 11 and 12 to attenuate the noise contained in the output signal of the input stage amplifier 11.

The output signal of the amplifier 11 is provided to the AGC circuit 14. The AGC circuit 14 detects the output signal level of the amplifier 11 and provides a control signal to the amplifier 11 so that the output signal level of the amplifier 11 is kept constant. More specifically, the AGC circuit 14 functions to increase the gain of the amplifier 11 when the output signal level of the amplifier 11 decreases. Further, the AGC circuit 14 functions to decrease the gain of the amplifier 11 when the output signal level increases.

The control signal of the AGC circuit 14 is also provided to the CGA circuit (first gain adjustment circuit) 15. The CGA circuit 15 provides an adjustment signal to the amplifier 12 for adjusting the gain of the amplifier 12 in accordance with the control signal of the AGC circuit 14. More specifically, the CGA circuit 15 functions to decrease the gain of the amplifier 12 when the gain of the amplifier 11 is increased by the control signal of the AGC circuit 14. Further, the CGA circuit 15 functions to increase the gain of the amplifier 12 when the gain of the amplifier 11 is decreased by the control signal of the AGC circuit 14. Therefore, the total gains of the amplifiers 11 and 12 are adjusted to be constant by the AGC circuit 14 and the CGA circuit 15.

Figure 3:
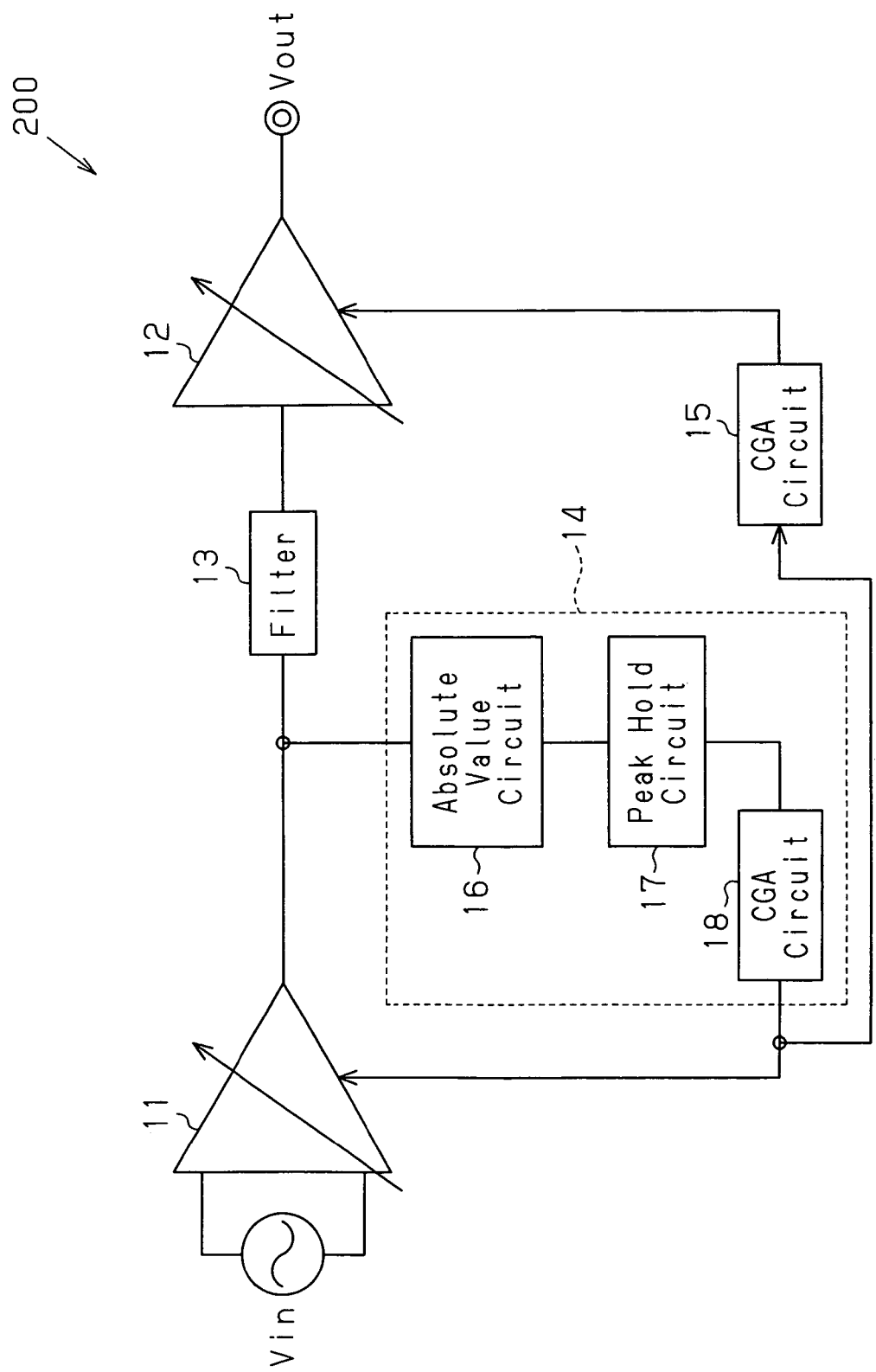
FIG. 3 is a schematic block diagram of the analog multistage amplification circuit of FIG. 2.

FIG. 3 is a schematic block diagram of the analog multistage amplification circuit 200 showing the configuration of the AGC circuit 14. The AGC circuit 14 includes an absolute value circuit 16, a peak hold circuit 17, and a CGA circuit (second gain adjustment circuit) 18. The output signal of the amplifier 11 is provided to the absolute value circuit 16, and the output signal of the absolute value circuit 16 is provided to the peak hold circuit 17. Further, the output signal of the peak hold circuit 17 is provided to the CGA circuit 18.

Figure 4:
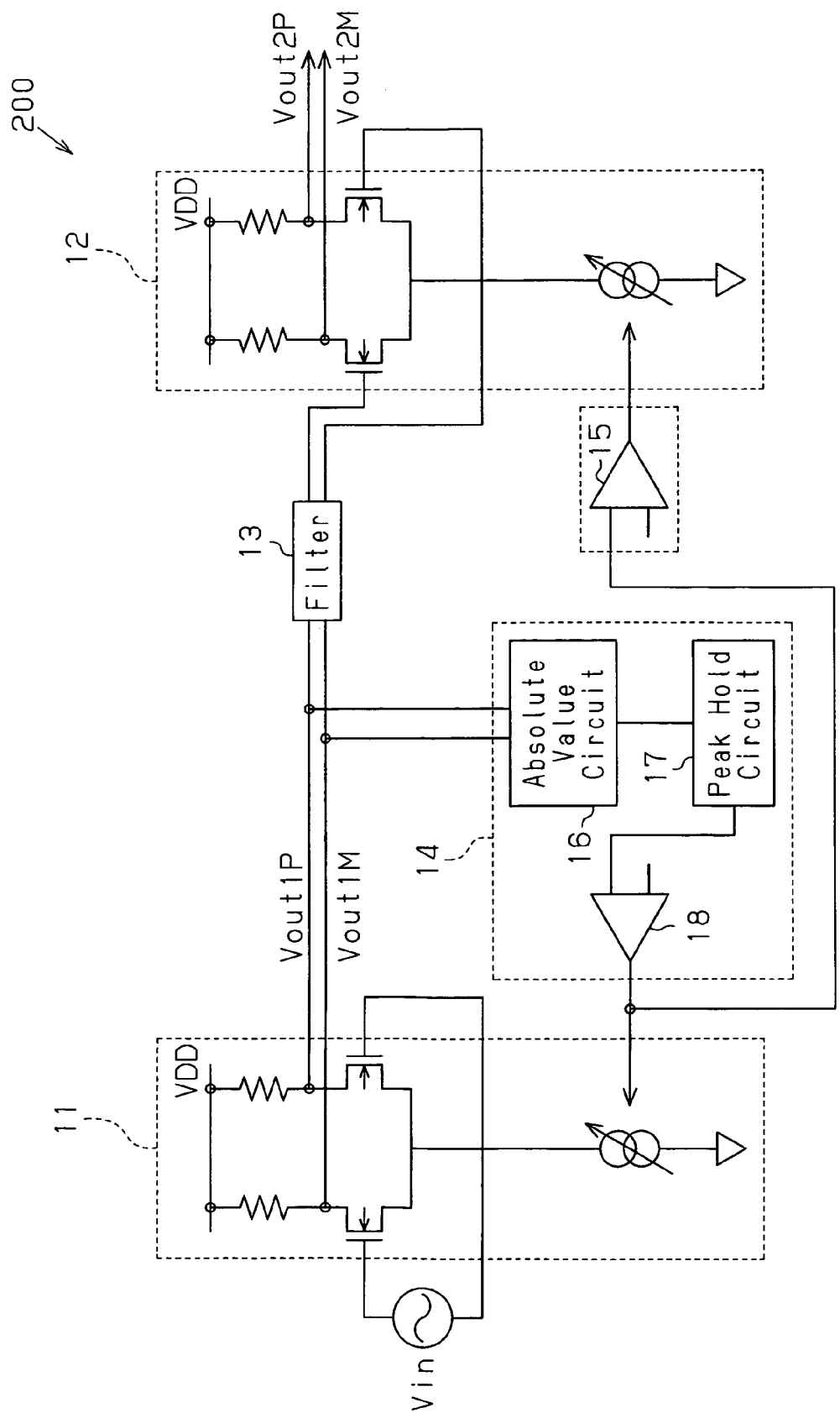
FIG. 4 is a schematic circuit diagram of the analog multistage amplification circuit of FIG. 2.

FIG. 4 is a schematic circuit diagram of the absolute value circuit in the analog multistage amplification circuit and shows the configuration of the amplifiers 11 and 12. The amplifiers 11 and 12 are each configured by a differential amplification circuit. The amplifier 11 amplifies the input signal Vin and generates output signals Vout1P and Vout1M. The amplifier 12 amplifies the potential difference of the output signals Vout1P and Vout1M of the amplifier 11 provided via the filter 13 and generates output signals Vout2P and Vout2M.

The CGA circuit 18 controls the gain of the amplifier 11 by providing the amplifier 11 with a control signal for controlling operation current of the amplifier 11. Further, the control signal of the CGA circuit 18 is provided to the CGA circuit 15, which controls the gain of the amplifier 12 by providing the amplifier 12 with a control signal for controlling operation current of the amplifier 12 in accordance with the control signal of the CGA circuit 18.

Figure 5:
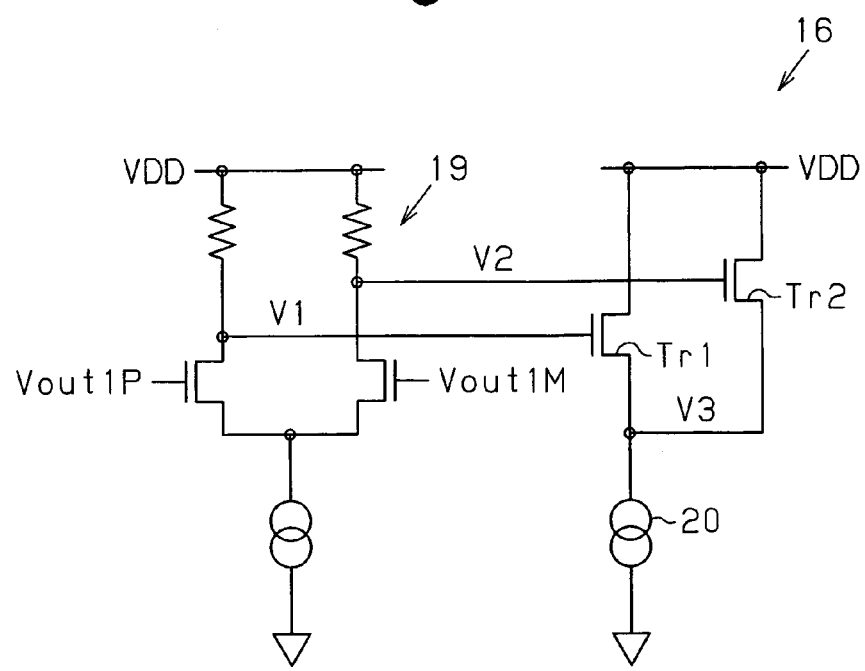
FIG. 5 is a schematic circuit diagram of an absolute value circuit in the analog multistage amplification circuit of FIG. 4.

FIG. 5 is a schematic circuit diagram of the absolute value circuit 16. The absolute value circuit 16 includes a differential circuit 19, transistors Tr1 and Tr2, and a current source 20. The differential circuit 19 receives the output signals Vout1P and Vout1M of the amplifier 11 as input signals and generates output signals V1 and V2. The output signals V1 and V2 are respectively provided to the gate of the N-channel MOS transistors Tr1 and Tr2. The transistors Tr1 and Tr2 have drains connected to a power supply VDD and sources connected to the current source 20. An output signal V3 is generated from the sources of the two transistors Tr1 and Tr2.

Figure 6:
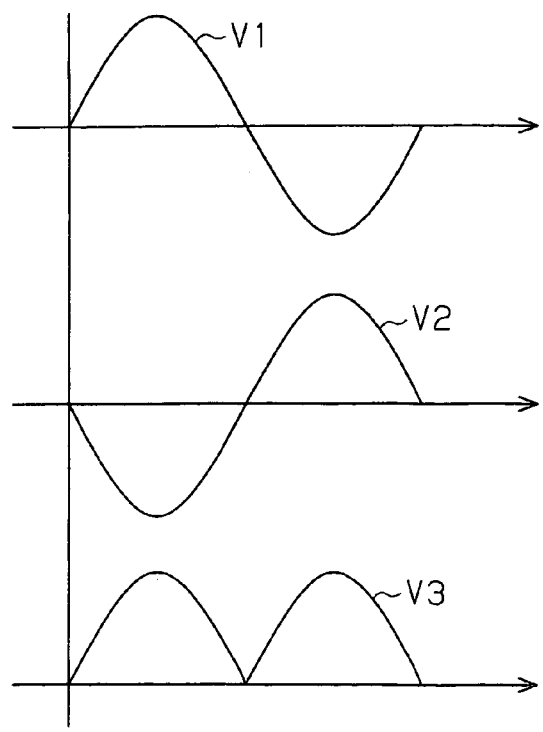
FIG. 6 is a waveform chart showing the operation of the absolute value circuit of FIG. 5.

FIG. 6 is a waveform chart showing the operation of the absolute value circuit 16. The output signals V1 and V2 of the differential circuit 19 are generated as signals complementary to each other based on the output signals Vout1P and Vout1M of the amplifier 11. The output signal V3 of the absolute value circuit 16 has a waveform obtained by extracting components on the positive side of a median value of the output signals V1 and V2. Thus, the absolute value circuit 16 generates an absolute value of the output signals V1 and V2 of the differential circuit 19.

Figure 7:
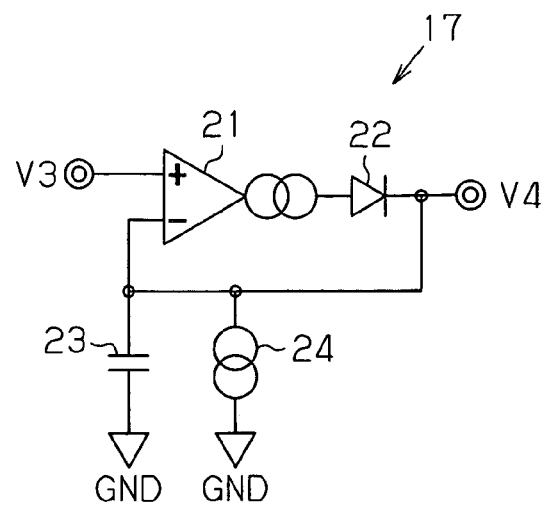
FIG. 7 is a schematic circuit diagram of a peak hold circuit in the analog multistage amplification circuit of FIG. 4.

FIG. 7 is a schematic circuit diagram of the peak hold circuit 17. The output signal V3 of the absolute value circuit 16 is input to a positive input terminal of an amplifier 21, and the output signal of the amplifier 21 is output via a diode 22 from the peak hold circuit 17 as an output signal V4. The output signal V4 is provided to a negative input terminal of the amplifier 21. Further, the negative input terminal of the amplifier 21 is connected to ground GND via a capacitor 23. The negative input terminal of the amplifier 21 is also connected to ground GND via a constant current source 24 (or resistor).

Figure 8:
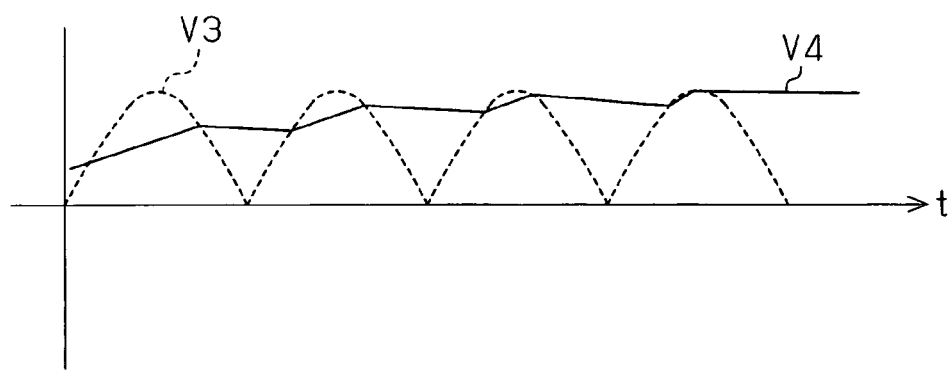
FIG. 8 is a waveform chart showing the operation of the peak hold circuit of FIG. 7.

FIG. 8 is a waveform chart showing the operation of the peak hold circuit 17. The output signal of the amplifier 21 and the charging and discharging of the capacitor 23 and the constant current source 24 gradually increases and ultimately converges the output signal V4 at a peak value of the output signal V3 generated by the absolute value circuit 16. In this manner, the peak hold circuit 17 holds the peak value of the output signal V3 generated by the absolute value circuit 16.

The amplification circuit 200 of the first embodiment has the advantages described below.

(1) The gain of the amplifier 11 is automatically adjusted in accordance with the level of the input signal Vin while keeping the total gain of the amplifiers 11 and 12 constant. That is, the gain of the amplifier 11 is automatically increased when the level of the input signal Vin decreases. Therefore, the output signal of the amplifier 11 is constantly set to the maximum amplitude.

(2) The amplifier 11 is constantly set to the maximum amplitude. Further, after the filter 13 removes noise from the output signal, the amplifier 12 performs amplification. This improves the S/N ratio.

Figure 9:
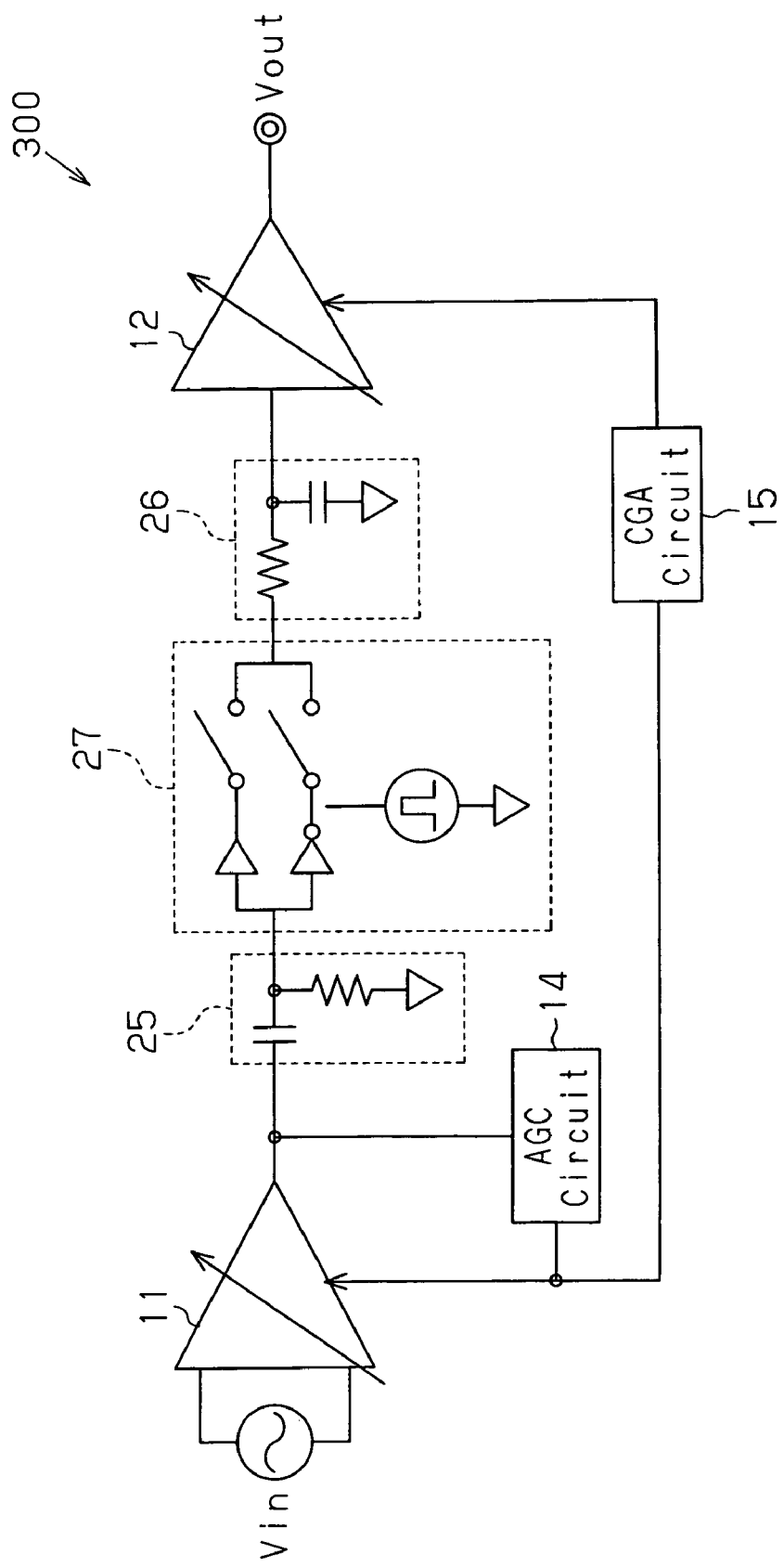
FIG. 9 is a schematic circuit diagram of an analog multistage amplification circuit according to a second embodiment of the present invention.

FIG. 9 is a schematic circuit diagram of an analog multistage amplification circuit 300 according to a second embodiment of the present invention. The amplification circuit 300 of the second embodiment includes a high-pass filter 25 and a low-pass filter 26, which are connected between the amplifiers 11 and 12, and a synchronization wave detection circuit 27, which is connected between the filters 25 and 26.

The synchronization wave detection circuit 27 is a known circuit and functions to retrieve only frequency components that are the same as the input signal Vin from the output signal of the high-pass filter 25. The high-pass filter 25, the synchronization wave detection circuit 27, and the low-pass filter 26 attenuate the noise components contained in the output signal of the amplifier 11.

The amplification circuit 300 includes the AGC circuit 14 and the CGA circuit 15. In the second embodiment, the high-pass filter 25, the synchronization wave detection circuit 27, and the low-pass filter 26 improve the S/N ratio of the output signal Vout. Additionally, the AGC circuit 14 and the CGA circuit 15 function to further improve the S/N ratio.

Figure 10:
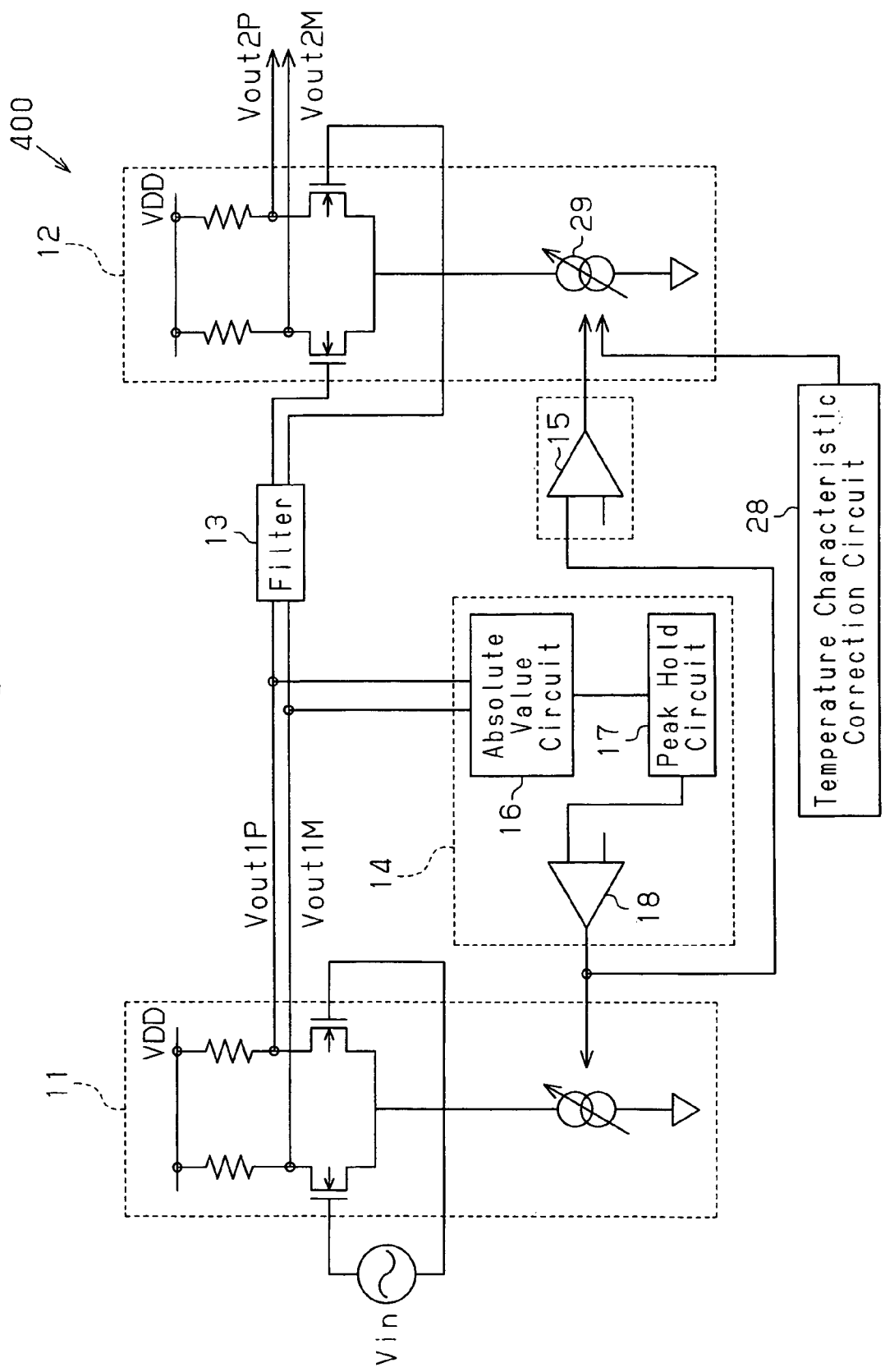
FIG. 10 is a schematic circuit diagram of an analog multistage amplification circuit according to a third embodiment of the present invention.

FIG. 10 is a schematic circuit diagram of an analog multistage amplification circuit 400 according to a third embodiment of the present invention. The third embodiment includes a temperature characteristic correction circuit 28, which is known in the art, to provide the amplifier 12 of the first embodiment with a temperature correcting function. An output signal of the temperature characteristic correction circuit 28 is provided to a current source 29 of the amplifier 12 in order to control the operation current of the amplifier 12. Such control corrects the temperature characteristic of the input signal Vin output from a sensor.

Figure 11:
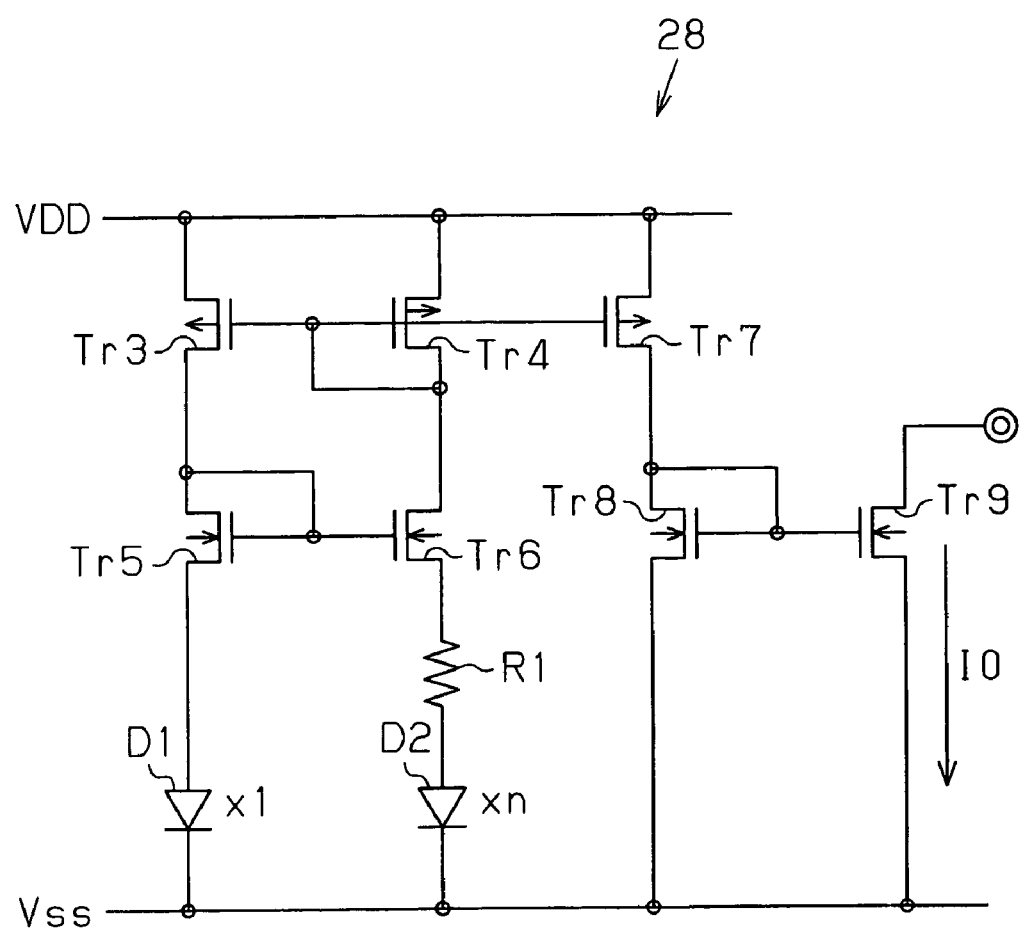
FIG. 11 is a schematic circuit diagram of a temperature characteristic correction circuit in the analog multistage amplification circuit of FIG. 10.

FIG. 11 is a schematic circuit diagram of the temperature characteristic correction circuit 28. The temperature characteristic correction circuit 28 includes seven transistors Tr3 to Tr9 and two diodes D1 and D2. The transistors Tr3 to Tr6 form a current mirror circuit. The source of the transistor Tr5 is connected to a power supply VSS via the diode D1, and the source of the transistor Tr6 is connected to the power supply VSS via the resistor R1 and the diode D2. The junction surfaces of the diodes D1 and D2 are set to be 1:n, in which the diode D2 has a junction surface that is n times greater than that of the diode D1.

The transistors Tr7 to Tr9 perform a current mirror operation with the transistors Tr3 to Tr6, and drain current IO of the transistor Tr9 is supplied to the current source 29 of the amplifier 12 as the output current. The output current IO, which is generated based on the resistor R1 and the temperature characteristics and junction area ratio of the diodes D1 and D2, changes in accordance with changes in the ambient temperature. When the output current IO supplied to the current source 29 changes in accordance with a change in the ambient temperature, the amplifier 12 operates to correct the temperature characteristic of the sensor. In the amplification circuit 400 provided with the function for correcting the temperature characteristic of the sensor of the third embodiment, the AGC circuit 14 and the CGA circuit 15 improves the S/N ratio of the output voltage Vout.

Figure 12:
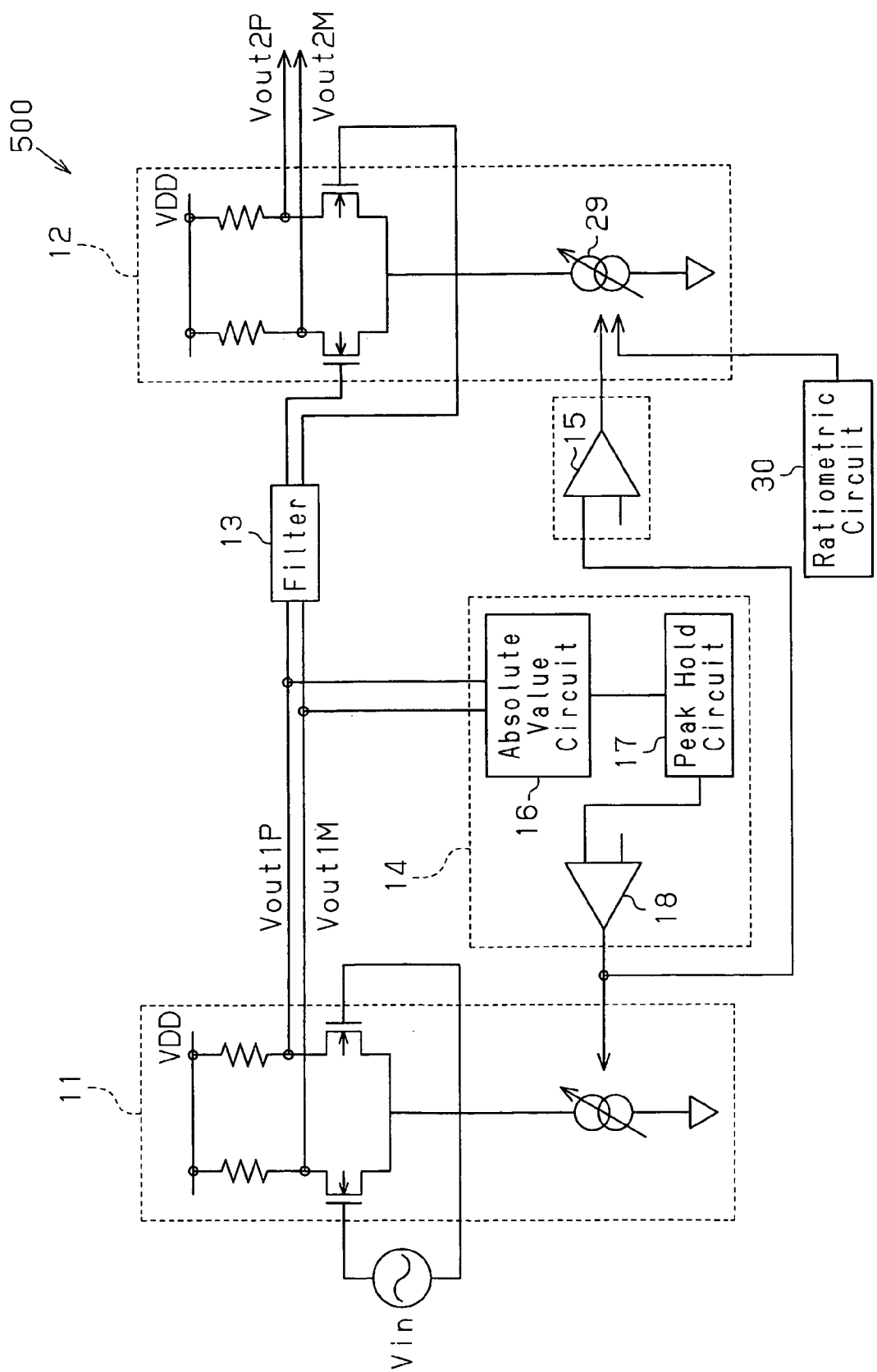
FIG. 12 is a schematic circuit diagram of an analog multistage amplification circuit according to a fourth embodiment of the present invention.

FIG. 12 is a schematic circuit diagram of an analog multistage amplification circuit 500 according to a fourth embodiment of the present invention. The amplification circuit 500 of the fourth embodiment includes a ratiometric circuit 30 for providing the amplifier 12 of the first embodiment with a known ratiometric function. The output signal of the ratiometric circuit 30 is provided to the current source 29 of the amplifier 12 to control the operation current of the amplifier 12. Changes in the output voltages Vout2P and Vout2M is controlled in accordance with changes in the power supply voltage.

Figure 13:
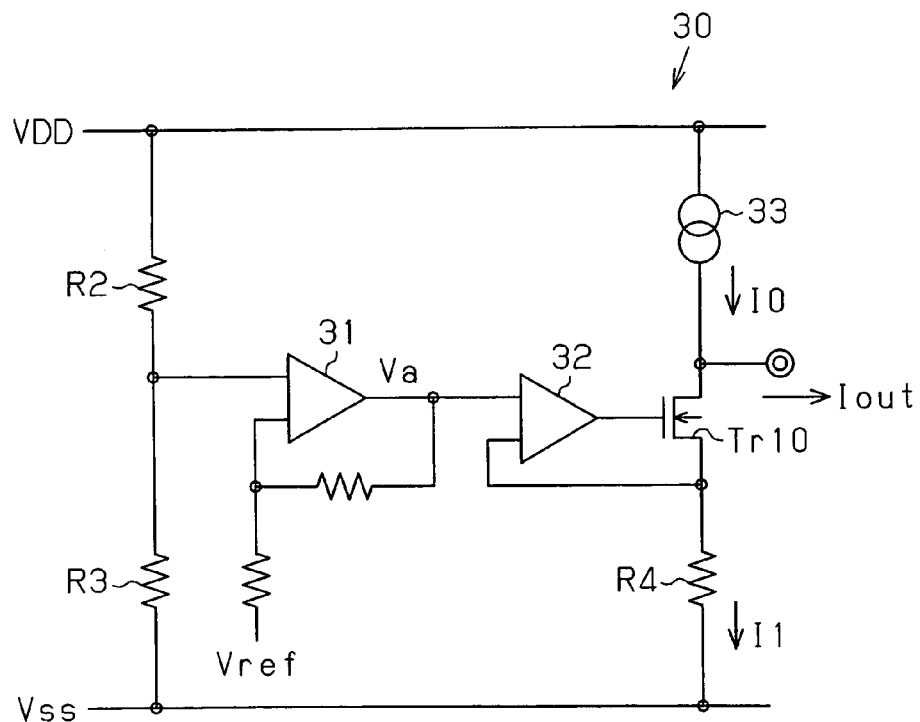
FIG. 13 is a schematic circuit diagram of a ratiometric circuit in the analog multistage amplification circuit of FIG. 12.

FIG. 13 is a schematic circuit diagram of the ratiometric circuit 30. The ratiometric circuit 30 includes three resistors R2 to R4, amplifiers 31 and 32, a current source 33, and a transistor Tr10. The amplifier 31 is supplied with a voltage generated by dividing the potential difference between the power supply VDD and the power supply VSS with resistors R2 and R3. The ratiometric circuit 30 is also supplied with a reference voltage Vref. The amplifier 31 generates output voltage Va based on the potential difference between the power supply VDD and the power supply VSS and supplies the output voltage Va to a first input terminal of the amplifier 32.

The output signal of the amplifier 32 is applied to the gate of the transistor Tr10. The source of the transistor Tr10 is connected to a second input terminal of the amplifier 32 and to the power supply VSS via the resistor R4. The drain of the transistor Tr10 is supplied with constant current IO from the current source 33.

The amplifier 32 controls the drain current I1 of the transistor Tr10 so that the two input voltages of the amplifier 32 both substantially match the output voltage Va of the amplifier 31. Accordingly, output current Iout of the ratiometric circuit 30 is generated by subtracting the drain current I1 from the constant current Io.

In the ratiometric circuit 30, the output voltage Va of the amplifier 31 changes in accordance with changes in the fluctuation of the power supply voltage. More specifically, the output voltage Va increases when the power supply VDD increases, and the output voltage Va decreases when the power supply VDD decreases. The drain current I1 of the transistor Tr10 increases and the output current Iout decreases when the output voltage Va of the amplifier 31 increases. The drain current I1 of the transistor Tr10 decreases and the output current Iout increases when the output voltage Va of the amplifier 31 decreases. The output current Iout of the ratiometric circuit 30 is supplied to the current source 29 of the amplifier 12. Accordingly, the amplifier 12 generates the output signals Vout2P and Vout2M in proportion to changes in the power supply voltage.

In the analog multistage amplification circuit 500 of the fourth embodiment, the total gain is proportional to the power supply voltage.

Figure 14:
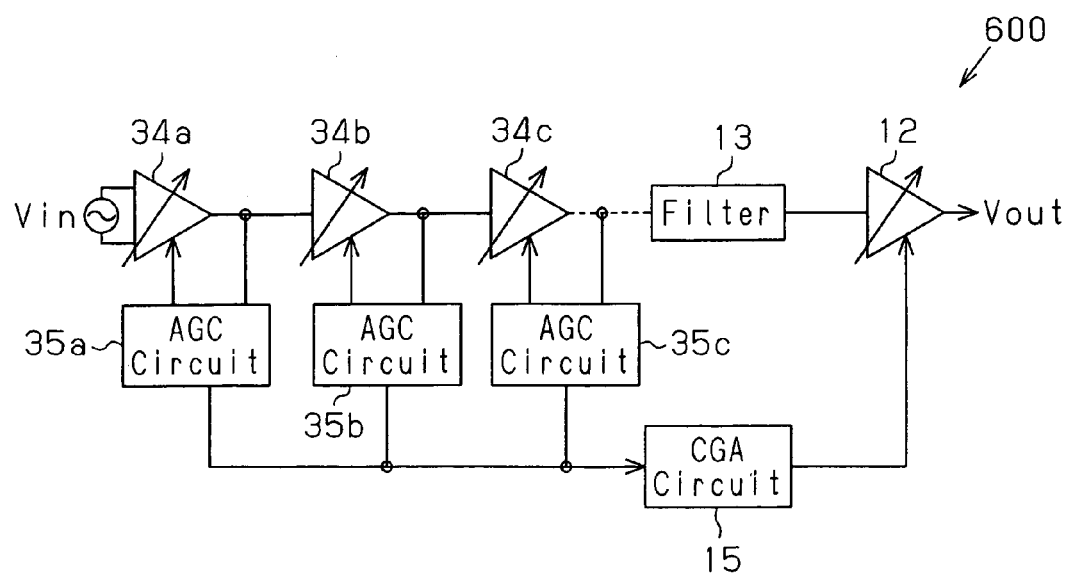
FIG. 14 is a schematic block diagram of an analog multistage amplification circuit according to a fifth embodiment of the present invention.

FIG. 14 is a schematic block diagram of an analog multistage amplification circuit 600 according to a fifth embodiment of the present invention. The amplification circuit 600 of the fifth embodiment includes a plurality of amplifiers 34*a*, 34*b*, and 34*c* connected in series in a preceding stage of the filter 13. The amplifiers 34*a* to 34*c* amplify the input signal Vin and provide the amplified input signal Vin to the filter 13.

The output signals of the amplifiers 34*a* to 34*c* are respectively controlled by the AGC circuits 35*a* to 35*c* so as to have a predetermined level. The control signals of the AGC circuits 35*a* to 35*c* are provided to the CGA circuit 15, and the CGA circuit 15 controls the total gain of the amplifiers 34*a* to 34*c* and 12 to be constant.

In the amplification circuit 600 of the fifth embodiment, the input signal Vin passes through the filter 13 after being sufficiently amplified by the amplifiers 34*a* to 34*c* in the preceding stage of the filter 13. Then, the input signal Vin is amplified by the amplifier 12, which has a suppressed gain. Thus, the S/N ratio is further improved.

Figure 15:
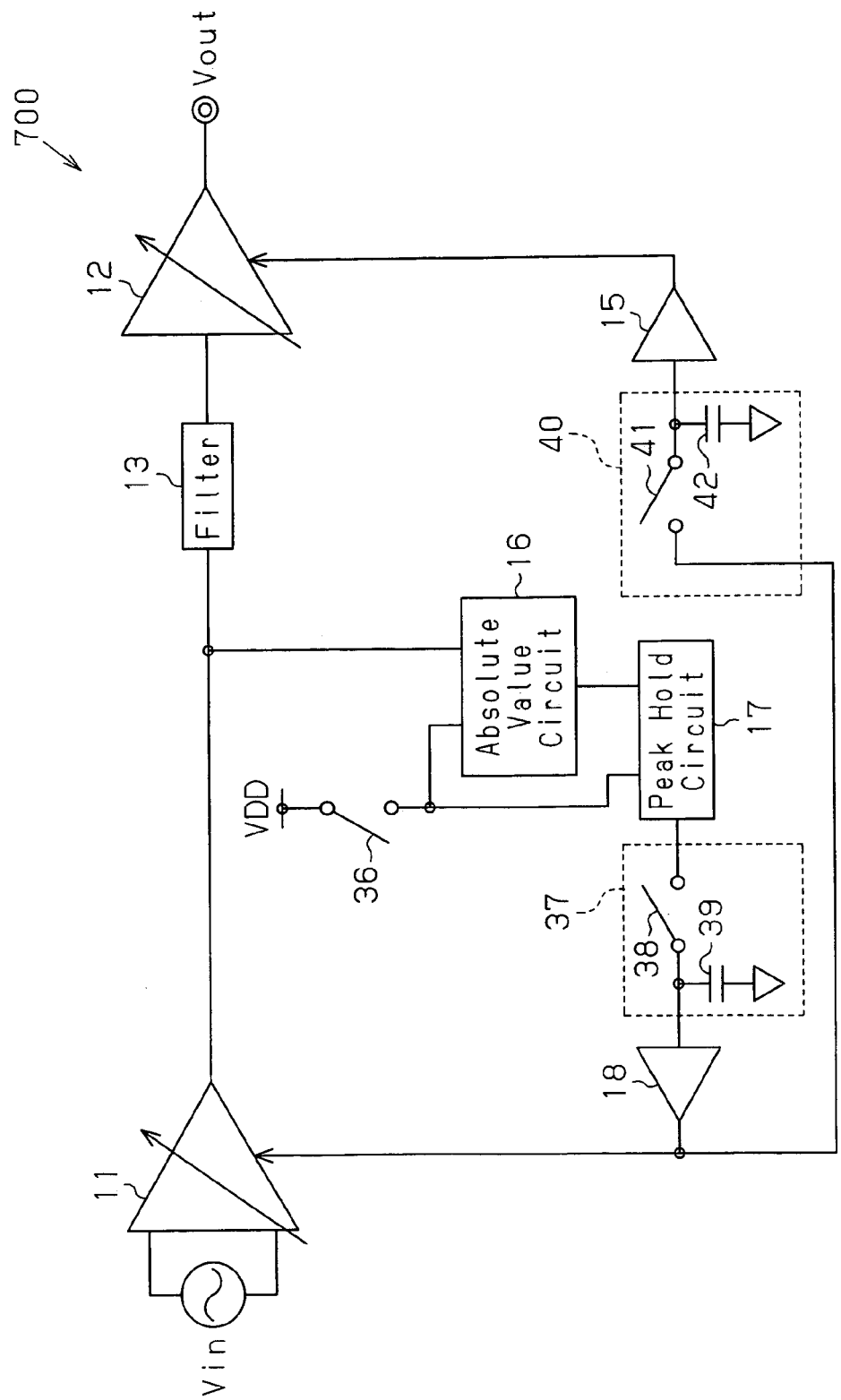
FIG. 15 is a schematic circuit diagram of an analog multistage amplification circuit according to a sixth embodiment of the present invention.

FIG. 15 is a schematic circuit diagram of an analog multistage amplification circuit 700 according to a sixth embodiment of the present invention. The amplification circuit 700 of the sixth embodiment includes a switch circuit 36, which intermittently operates the absolute value circuit 16 and the peak hold circuit 17 to reduce power consumption, and first and second data hold circuits 37 and 40.

The power supply VDD is connected to the absolute value circuit 16 and the peak hold circuit 17 via the switch circuit 36. The output signal of the peak hold circuit 17 is provided to the CGA circuit 18 via the first data hold circuit 37. The first data hold circuit 37 includes a switch circuit 38, which opens and closes in synchronization with the switch circuit 36, and a capacitor 39, which is capable of holding the voltage level of the output signal of the peak hold circuit 17.

The output signal of the CGA circuit 18 is provided to the CGA circuit 15 via the second data hold circuit 40. The second data hold circuit 40 includes a switch circuit 41, which opens and closes in synchronization with the switch circuit 36, and a capacitor 42, which is capable of holding the voltage level of the output signal of the CGA circuit 18.

In the amplification circuit 700 of the sixth embodiment, the switch circuits 36, 38, and 41 are intermittently opened and closed. The amplification circuit 700 functions in a manner similar to the amplification circuit 200 of the first embodiment when the switch circuits 36, 38, 41 become electrically conductive. The voltage level of the output signal of the peak hold circuit 17 is held by the capacitor 39, and the voltage level of the output signal of the CGA circuit 18 is held by the capacitor 42.

When the conductive state of the switch circuits 36, 38, and 41 is ended, the CGA circuits 15, 18 continue to function based on the voltage level held by the capacitors 39 and 42. In this state, the supply of power supply VDD to the absolute value circuit 16 and the peak hold circuit 17 is stopped. Therefore, the amplification circuit 700 of the sixth embodiment has the same effects as the amplification circuit 200 of the first embodiment and reduces power consumption by intermittently operating the absolute value circuit 16 and the peak hold circuit 17 through the opening and closing operation of the switch circuits 36, 38, and 41.

Figure 16:
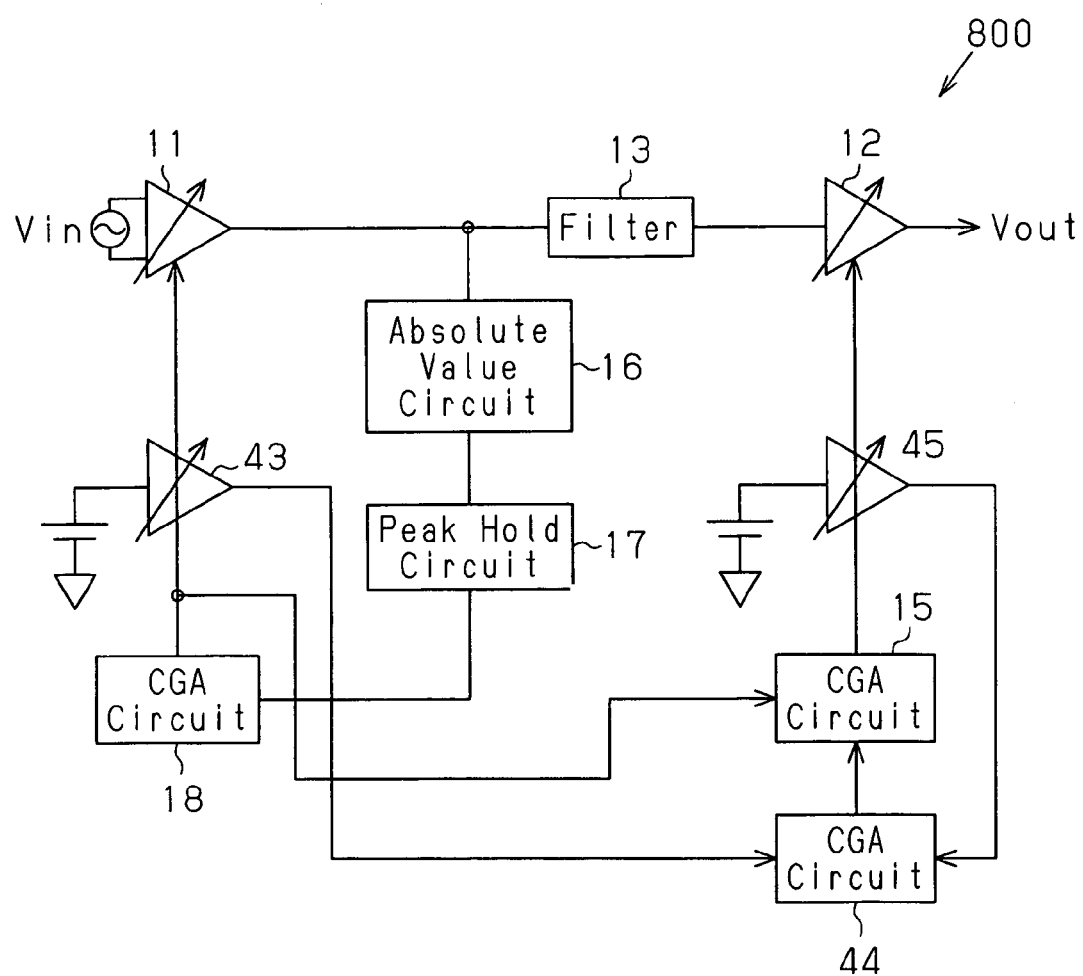
FIG. 16 is a schematic block diagram of an analog multistage amplification circuit according to a seventh embodiment of the present invention.

FIG. 16 is a schematic block diagram of an analog multistage amplification circuit 800 according to a seventh embodiment of the present invention. The amplification circuit 800 of the seventh embodiment includes a first gain monitor amplifier 43 for accurately setting the gain of the amplifiers 11 and 12, a CGA circuit (third gain adjustment circuit) 44, and a second gain monitor amplifier 45.

The CGA circuit 18 provides the control signal to the amplifier 11 and the first gain monitor amplifier 43. Further, an input signal having a predetermined fixed level is provided to the first gain monitor amplifier 43. The first gain monitor amplifier 43 adjusts the gain based on the control signal of the CGA circuit 18 and provides a gain monitor output signal to the CGA circuit 44.

The CGA circuit 15 provides the control signal to the amplifier 12 and the second gain monitor amplifier 45. An input signal having a predetermined fixed level is provided to the second gain monitor amplifier 45. The second gain monitor amplifier 45 adjusts the gain based on the control signal of the CGA circuit 15 and provides a gain monitor output signal to the CGA circuit 44.

The CGA circuit 44 detects the gain of both amplifiers 43 and 45 based on the output signals of the first and second gain monitor amplifiers 43 and 45 and provides the control signal to the CGA circuit 15. The CGA circuit 15 then adjusts the gain of the amplifier 12 and the second gain monitor amplifier 45 in accordance with the control signal provided from the CGA circuit 44.

In the amplification circuit 800 of the seventh embodiment, the gains of the amplifiers 11 and 12 are detected by monitoring the gains of the first and second gain monitor amplifiers 43 and 45, and the gains of the amplifiers 11 and 12 are adjusted based on the detected result. Therefore, the total gain of the amplifiers 11 and 12 is accurately kept constant.

It should be apparent to those skilled in the art that the present invention may be embodied in many other specific forms without departing from the spirit or scope of the invention. Particularly, it should be understood that the present invention may be embodied in the following forms.

The amplification circuit of the first to the seventh embodiments may be combined as required to form a different amplification circuit.

The present examples and embodiments are to be considered as illustrative and not restrictive, and the invention is not to be limited to the details given herein, but may be modified within the scope and equivalence of the appended claims.

What is claimed is:

1. An analog multistage amplification circuit comprising:
    an input stage amplifier for receiving an input signal and generating a first output signal;
    a filter, connected to the input stage amplifier, for attenuating a noise component contained in the first output signal and generating a filtered first signal;
    an output stage amplifier, connected to the filter, for receiving the filtered first output signal and generating a second output signal;
    an auto gain control circuit, connected to the input stage amplifier, for generating a control signal for controlling gain of the input stage amplifier based on the first output signal of the input stage amplifier so that the first output signal has a maximum level; and
    a first gain adjustment circuit, connected to the output stage amplifier and the auto gain control circuit, for generating an adjustment signal for adjusting the gain of the output stage amplifier so that the total gain of the input stage amplifier and the output stage amplifier is kept constant in accordance with the control signal of the auto gain control circuit.

2. The analog multistage amplification circuit according to claim 1, wherein the auto gain control circuit includes:

an absolute value circuit, connected to the input stage amplifier, for generating an absolute value of the first output signal of the input stage amplifier;

a peak hold circuit, connected to the absolute value circuit, for holding the peak of the absolute value of the first output signal and generating a peak hold absolute value signal; and a second gain adjustment circuit, connected to the peak hold circuit and the input stage amplifier, for generating a control signal for controlling the gain of the input stage amplifier based on the peak hold absolute value signal.

3. The analog multistage amplification circuit according to claim 2, further comprising:

a first switch circuit, connected between the absolute value circuit, the peak hold circuit, and a power supply, for selectively inactivating the absolute value circuit and the peak hold circuit;

a first data hold circuit, connected between the peak hold circuit and the second gain adjustment circuit, for temporarily holding the peak hold absolute value signal of the peak hold circuit when the absolute value circuit and the peak hold circuit are inactivated and providing the temporarily held peak hold absolute value signal to the second gain adjustment circuit; and a second data hold circuit, connected between the first gain adjustment circuit and the second gain adjustment circuit, for temporarily holding the control signal of the second gain adjustment circuit when the absolute value circuit and the peak hold circuit are inactivated and providing the temporarily held control signal to the first gain adjustment circuit.

4. The analog multistage amplification circuit according to claim 3, wherein:

the first data hold circuit includes:
  a second switch circuit connected between the peak hold circuit and the second gain adjustment circuit; and
  a first capacitor connected to a node between the second switch circuit and the second gain adjustment circuit; and the second data hold circuit includes:
  a third switch circuit connected between the first gain adjustment circuit and the second gain adjustment circuit; and
  a second capacitor connected to a node between the third switch circuit and the first gain adjustment circuit.

5. The analog multistage amplification circuit according to claim 2, further comprising:

a first gain monitor amplifier, connected to the second gain adjustment circuit, for controlling the gain in accordance with the control signal of the second gain adjustment circuit and generating a first gain monitor output signal;

a second gain monitor amplifier, connected to the first gain adjustment circuit, for adjusting the gain in accordance with the adjustment signal of the first gain adjustment circuit and generating a second gain monitor output signal; and a third gain adjustment circuit, connected to the first and second gain monitor amplifiers and the first gain adjustment circuit, for controlling the first gain adjustment circuit based on the first and second gain monitor output signals.

6. The analog multistage amplification circuit according to claim 1, wherein the filter includes:

a high-pass filter connected to the input stage amplifier;

a synchronization wave detection circuit connected to the high-pass filter; and a low-pass filter connected between the synchronization wave detection circuit and the output stage amplifier.

7. The analog multistage amplification circuit according to claim 1, further comprising:

a temperature characteristic correction circuit, connected to the output stage amplifier, for operating the output stage amplifier so as to correct the temperature characteristic of the input signal.

8. The analog multistage amplification circuit according to claim 7, wherein the temperature characteristic correction circuit includes:

a first current mirror circuit;

first and second diodes connected in parallel to the first current mirror circuit;

a resistor connected between the second diode and the first current mirror circuit; and a second current mirror circuit connected to the first current mirror circuit.

9. The analog multistage amplification circuit according to claim 1, further comprising:

a ratiometric circuit, connected to the output stage amplifier, for operating the output stage amplifier so that the total gain changes in proportion to the power supply voltage.

10. The analog multistage amplification circuit according to claim 9, wherein the ratiometric circuit includes:

first and second resistors connected in series between a high potential power supply and a low potential power supply;

a first amplifier including a first input terminal, connected to a node between the first resistor and the second resistor, a second input terminal, for receiving reference voltage, and an output terminal;

a second amplifier including a first input terminal, connected to the output terminal of the first amplifier, a second input terminal, and an output terminal;

a transistor including a gate, connected to the output terminal of the second amplifier, a first terminal, connected to the second input terminal of the second amplifier, and a second terminal;

a current source connected between the second terminal of the transistor and the high potential power supply; and a resistor connected between the first terminal of the transistor and the low potential power supply.

11. The analog multistage amplification circuit according to claim 1, wherein the input stage amplifier is one of a plurality of input stage amplifiers, and the auto gain control circuit is one of a plurality of auto gain control circuits respectively connected to the plurality of input stage amplifiers.

* * * * *